United States Patent
Lortz et al.

(10) Patent No.: US 6,905,632 B2
(45) Date of Patent: Jun. 14, 2005

(54) DISPERSION FOR CHEMICAL MECHANICAL POLISHING

(75) Inventors: Wolfgang Lortz, Waechtersbach (DE); Christoph Batz-Sohn, Hanau (DE); Gabriele Perlet, Grosskrotzenburg (DE); Werner Will, Gelnhausen (DE)

(73) Assignee: Degussa AG, Duesseldorf (DE)

( * ) Notice: Subject to any disclaimer, the term of this patent is extended or adjusted under 35 U.S.C. 154(b) by 69 days.

(21) Appl. No.: 10/354,969

(22) Filed: Jan. 31, 2003

(65) Prior Publication Data

US 2003/0150838 A1 Aug. 14, 2003

(30) Foreign Application Priority Data

Feb. 7, 2002 (DE) ......................................... 102 05 280

(51) Int. Cl.$^7$ ...................... H01L 21/302; C09K 13/00
(52) U.S. Cl. .................... 252/79.1; 252/79.2; 252/79.3; 252/79.4
(58) Field of Search .............................. 252/79.1, 79.2, 252/79.3, 79.4

(56) References Cited

U.S. PATENT DOCUMENTS

| 6,447,372 | B1 | * | 9/2002 | Bradl et al. ................... 451/41 |
| 6,455,455 | B1 | * | 9/2002 | Deller et al. ................. 501/153 |
| 6,695,907 | B2 | * | 2/2004 | Scharfe et al. .............. 106/482 |
| 2001/0042493 | A1 | | 11/2001 | Scharfe et al. |
| 2002/0121156 | A1 | * | 9/2002 | Menzel et al. ................. 75/255 |
| 2003/0185739 | A1 | * | 10/2003 | Mangold et al. ............ 423/335 |

FOREIGN PATENT DOCUMENTS

| CA | 2307057 | 10/2000 |
| EP | 0995718 | 4/2000 |
| EP | 1 048 617 | 11/2000 |
| EP | 1148026 | 10/2001 |
| EP | 1 234 800 | 8/2002 |

* cited by examiner

Primary Examiner—George A. Goudreau
(74) Attorney, Agent, or Firm—Oblon, Spivak, McClelland, Maier & Neustadt, P.C.

(57) ABSTRACT

An aqueous dispersion is used in the chemical mechanical polishing of surfaces, particularly oxidic surfaces, such as silicon dioxide. The aqueous dispersion contains a powder of pyrogenically produced silicon dioxide doped with 0.01 and 3 wt. % aluminium oxide, relative to the total amount of powder, said powder having an average particle diameter in the dispersion of not more than 0.1 $\mu$m.

9 Claims, No Drawings

DISPERSION FOR CHEMICAL MECHANICAL POLISHING

BACKGROUND OF THE INVENTION

1. Field of the Invention

The invention relates to an aqueous dispersion for the chemical mechanical polishing of an oxidic surface and a process for its production.

2. Discussion of the Background

Aqueous dispersions containing silicon dioxide are used in a broad range of applications. Examples of applications include the coating of paper, the production of glass fibers and quartz glass, and the chemical mechanical polishing of semiconductor substrates (CMP process).

Conventional dispersions mostly originate from colloidal silicon dioxide, silica sols, or from pyrogenically produced silicon dioxide.

Dispersions containing colloidal silicon dioxide generally have a defined, small particle size and a good dispersion stability. In chemical mechanical polishing, the defect rate, for example the number of scratches, on the polished surface is low. The disadvantage, however, is the low removal rate in the polishing of oxidic surfaces in comparison to dispersions containing pyrogenically produced silicon dioxide.

On the other hand, dispersions containing pyrogenically produced silicon dioxide cause a larger number of scratches due to the aggregation and agglomeration of primary particles, giving rise to hard particles. Dispersing the aggregates and agglomerates proves to be difficult, the dispersions are less stable and have a tendency to sediment or to gel.

EP-A-1148026 describes a dispersion of silicon dioxide doped with aluminum oxide by means of an aerosol and the use of this dispersion to manufacture coating slips in the ink-jet sector and for chemical mechanical polishing. An aqueous dispersion having a very broad range of aluminum oxide doping from 1 to 200,000 ppm is claimed. It has been found, however, that although a dispersion defined in this way can advantageously be used in the ink-jet sector, it does not display a satisfactory polishing performance in chemical mechanical polishing. Thus a dispersion produced according to EP-A-1148026 and containing a silicon dioxide powder doped with 20 wt. % aluminum oxide displays a very high defect rate, while a low-doped powder, containing for example 10 ppm aluminum oxide, displays a low removal rate.

SUMMARY OF THE INVENTION

It is an object of the present invention to provide a dispersion that permits a high removal rate in the chemical mechanical polishing of surfaces, particularly oxidic surfaces without leaving scratches on the surfaces to be polished.

This and other objects have been achieved by the present invention the first embodiment of which includes an aqueous dispersion for chemical mechanical polishing, comprising:

a powder of pyrogenically produced silicon dioxide doped with aluminum oxide;

wherein said powder comprises between 0.01 and 3 wt. % of said aluminium oxide; based on a total amount of said powder; and wherein an average particle diameter of said powder in said dispersion is not more than 0.1 $\mu$m.

In another embodiment, the present invention includes a process for producing the above aqueous dispersion, the process comprising:

doping a silicon dioxide with aluminum oxide using an aerosol, to obtain a doped silicon dioxide;

dispersing or dissolving said doped silicon dioxide in an aqueous medium with an energy input of at least 200 kJ/m$^3$.

In yet another embodiment, the present invention relates to a method for the chemical mechanical polishing of oxidic surfaces, comprising:

contacting said oxidic surface with the above aqueous dispersion.

DETAILED DESCRIPTION OF THE INVENTION

The present invention provides an aqueous dispersion for the chemical mechanical polishing of oxidic surfaces, containing a powder of pyrogenically produced silicon dioxide doped with aluminum oxide by means of an aerosol, which is characterized in that the powder has an aluminum oxide content of between 0.01 and 3 wt. %, preferably between 0.2 and 1.5 wt. %, relative to the total amount of powder, and an average particle diameter in the dispersion of not more than of 0.1 $\mu$m. The aluminum oxide content of the powder includes all values and subvalues therebetween, especially including 0.05, 0.1, 0.5, 1, 1.5, 2 and 2.5 wt. %. The average particle diameter of the powder includes all values and subvalues between 0.0005 and 0.1 $\mu$m, especially including 0.001, 0.005, 0.01, 0.05 and 0.1 $\mu$m.

The powder is prepared in accordance with EP-A-995718.

The average particle diameter in the dispersion can be determined by dynamic light scattering, for example. Both, the number-related and the volume-related average particle diameter are below 0.1 $\mu$m in the dispersion according to the present invention. The number-related and the volume-related average particle diameter each include all values and subvalues between 0.0005 and 0.1 $\mu$m, especially including 0.001, 0.005, 0.01, 0.05 and 0.1 $\mu$m.

In the chemical mechanical polishing of oxidic surfaces, the dispersion according to the present invention displays a very good removal rate without producing scratches. In a preferred embodiment of the present invention, the aluminum oxide content of the doped silicon dioxide powder is between 0.01 and 3 wt. %. With aluminum oxide contents below 0.01 wt. %, only a low removal rate is observed, while with aluminum oxide contents of more than 3 wt. % the number of scratches produced during polishing increases markedly. Both of the two previous statements relate to powders having an average particle size in the dispersion of below 0.1 $\mu$m. With an average particle size in the dispersion of over 0.1 $\mu$m the number of scratches likewise increases markedly.

The dispersion according to the present invention preferably has a pH from 8.5 to 11. The pH of the dispersion includes all values and subvalues therebetween, especially including 9, 9.5, 10 and 10.5. The pH can be adjusted with alkali hydroxide, preferably potassium hydroxide solution; ammonia or ammonium hydroxide solution; amines; and tetraalkyl ammonium salts, such as tetramethyl ammonium hydroxide. Buffer systems can also be used to stabilize the pH.

The content of powder in the dispersion according to the present invention can be between 5 and 50 wt. %, preferably greater than 10 wt. %. The content of powder in the dispersion includes all values and subvalues therebetween, especially including 10, 15, 20, 25, 30, 35, 40 and 45 wt. %.

The BET surface area of the powder in the dispersion according to the present invention can preferably be between 50 and 90 m²/g. The BET surface area of the powder includes all values and subvalues therebetween, especially including 55, 60, 65, 70, 75, 80 and 85 m²/g.

In order to stabilize the dispersion according to the present invention against sedimentation and flocculation, additives such as surface-active substances and dispersing agents or their mixtures are preferably added to it. The surface-active substances can be anionic, cationic, non-ionic or amphoteric or mixtures thereof. The quantity is governed by the individual surface-active substance and can vary between 0.001 and 2 wt. %. The amount of surface-active substance includes all values and subvalues therebetween, especially including 0.005, 0.01, 0.05, 0.1, 0.5, 1 and 1.5 wt. %. Sodium dodecyl sulfate, sodium lauryl sulfate, ammonium dodecyl sulfate or mixtures thereof are preferably used.

The present invention also provides a process for producing the dispersion according to the invention, which is characterized in that silicon dioxide doped with aluminum oxide by means of an aerosol is dispersed in an aqueous medium with an energy input of at least 200 kJ/m³.

Examples of suitable systems with which this energy input is possible include systems based on the rotor-stator principle, for example Ultra-Turrax machines, or attrition mills. Higher energy inputs are possible with a planetary kneader/mixer. Such a system is preferably used for dispersions with a high viscosity, which is necessary in order to introduce the high shear energies to break down the particles.

High-pressure homogenizers can preferably be used to prepare the dispersion according to the present invention. In these devices, two pre-dispersed streams of suspension are decompressed through a nozzle. The two jets of dispersion hit each other exactly and the particles grind themselves. In another preferred embodiment, the pre-dispersion is again placed under high pressure, but the particles collide against armored sections of wall. The operation can be repeated any number of times to obtain smaller particle sizes.

The present invention also provides for the use of the dispersion according to the invention for the chemical mechanical polishing of oxidic surfaces, preferably silicon dioxide. In this process, the oxidic surfaces are contacted with the dispersion according to the present invention.

Having generally described this invention, a further understanding can be obtained by reference to certain specific examples which are provided herein for purposes of illustration only, and are not intended to be limiting unless otherwise specified.

EXAMPLES

Analytical Methods

Particle size: The average particle size in the dispersion was determined with a Zeta sizer 3000 Hsa supplied by Malvern.

BET surface area: The surface area of the powders was determined in accordance with DIN 66131.

Viscosity: The viscosity of the produced dispersions was determined with an MCR 300 rotary rheometer supplied by Physica and a CC 27 measuring beaker. The viscosity value was determined at a shear rate of 500 1/sec. This shear rate was in a range in which the viscosity was virtually independent of the shear stress.

Sediment: Sedimentation was assessed by visual assessment in a 1000 ml wide-mouth polyethylene bottle after a residence time of one week. Any sediment that could have been present could easily be detected by carefully tilting the bottle.

Removal performance and non-uniformity: The removal performances achieved with the dispersions and the non-uniformity were determined by measuring the coating thickness with a Zeiss Axiospeed spectral photometer. Line scan measurements were performed on the wafer with 6 mm edge exclusion in each case. 25 wafers were polished and assessed in order to determine the average removal rate.

Defects: Examinations for defects (scratches and particles) were performed visually under a haze lamp or using a Censor ANS 100 surface particle counter.

Powders

Silicon dioxide powder P1 doped with 0.25 wt. % aluminum oxide and silicon dioxide powder P2 doped with 8 wt. % aluminum oxide were produced in accordance with EP-A-995718. P1 had a BET surface area of 55 m²/g, P2 had a BET surface area of 63 m²/g.

Dispersions

D1: 36 kg of demineralized water and 104 g of 30% KOH solution were placed in a 60-1 stainless steel batch vessel. 16.5 kg of powder P1 were taken up and coarsely pre-dispersed with the aid of a dispersing and induction mixer supplied by Ystral (at 4500 rpm). Following the introduction of the powder the dispersion was completed with a Z 66 rotor/stator continuous homogenizer from Ystral with four processing rings, a stator slot width of 1 mm and a speed of 11,500 rpm. During this 15-minute dispersion at 11,500 rpm, the pH was adjusted to 10.5 by adding additional KOH solution and held at that value. A further 779 g of KOH solution were used for this purpose and a solids concentration of 30 wt. % was established by the addition of 1.5 kg of water. The dispersion thus obtained was ground with a high-pressure homogenizer, an HJP-25050 Ultimaizer system supplied by Sugino Machine Ltd., under a pressure of 250 MPa and with a diamond nozzle diameter of 0.3 mm and two grinding cycles.

D2 and D3: Dispersion D2 was prepared from powder P2 and dispersion D3 was prepared from Aerosil 130 (BET surface area 130 m²/g) supplied by Degussa AG and referred to as P3. D2 and D3 were produced in the same way as dispersion D1.

Additional analytical data for these dispersions is set out in Table 1.

TABLE 1

Analytical data for dispersions D1 to D3[1]

| Dispersion | Av. particle diameter in the dispersion | | Viscosity[2] [mPas] | Sediment |
| --- | --- | --- | --- | --- |
| | Number [nm] | Volume [nm] | | |
| D1 | 62 | 78 | 4 | No |
| D2 | 87 | 99 | 5 | No |
| D3 | 100 | 140 | 15 | No |

[1]Solids content 30 wt. %, pH 10.5;
[2]at 500 1/sec.

In addition to dispersions D1 to D3, the following commercially available dispersions are also used for polishing:

D4: Klebosol 30N50 (Rodel), solids content 30 wt. %, stabilized with ammonia, pH9.5.

D5: Klebosol 1501 (Rodel), solids content 30 wt. %, stabilized with KOH, pH 10.9.

D6: Semi-Sperse 25 (Cabot Microelectronics), solids content 25 wt. %, stabilized with KOH, pH 11.0, diluted with water 1:1.

Polishing Process

Equipment: A P200 CMP cluster tool supplied by Peter Wolters CMP Systeme, fitted with a PM200 polishing machine and a brush cleaner supplied by Contrade, was used for the polishing tests. Cleaning tests were performed with water or ammonia.

The polishing head was fitted with a DF200 backing film from Rodel, and an IC 1000/ SubaIV pad, also from Rodel, was used as the polishing cloth. The parameters listed in Table 2 were used for the polishing process.

TABLE 2

Parameters for the polishing process[1]

| | |
|---|---|
| Force | 1500 N |
| Set-down point[2] | 190 mm |
| Back pressure inner[3] | 0 kPa |
| Back pressure outer[3] | 10 kPa |
| Oscillation | −10 mm |
| Chuck speed | 20 rpm |
| Polishing plate speed | 33 rpm |
| Dispersion flow rate | 180 ml/min |
| Polishing time | 60 sec |

[1]Temperature: approx. 25° C.;
[2]Distance from chuck center to polishing plate center in mm (diameter of polishing plate = 600 mm);
[3]A two-zone chuck was used, by means of which back pressure can be applied separately to two areas for improved uniformity.

Wafer: 200 mm Si wafer, coated with 1000 nm LPCVD TEOS (670° C., 750 mTorr).

Polishing Results

The dispersion according to the present invention containing silicon dioxide powder doped with 0.25 wt. % aluminium oxide and having an average particle size of below 0.1 $\mu$m displayed advantages when used for polishing in terms of removal rate and non-uniformity in comparison to the tested dispersions based on colloidal silicon dioxide, Klebosol 30N50 (D4) and 1501 (D5), and in comparison to the SS25 dispersion (D6) based on pyrogenic silicon dioxide. Of all the dispersions tested, D2 displayed the highest removal rate, but it was not suitable for polishing oxidic coatings because of the large number of defects.

The determination of defects after post-CMP cleaning produced similar values for all dispersions tested, with the exception of D2 (Table 3).

TABLE 3

Polishing results by line scan measurement[1]

| Dispersion | D1 | D2 | D3 | D4 | D5 | D6 |
|---|---|---|---|---|---|---|
| Removal (nm/min) | 459 | 493 | 355 | 287 | 326 | 353 |
| Non-uniformity[2] (%) | 5.2 | 7.1 | 6.7 | 5.3 | 6.2 | 5.9 |
| Defects[3] | 185 | 513 | 176 | 171 | 178 | 176 |

[1]Edge exclusion 6 mm;
[2]Standard deviation 1 sigma;
[3]Particle size 0.25–1.00 $\mu$m, Brushclean with 2% ammonia.

German patent application 102 05 280.8, filed Feb. 7, 2002, is incorporated herein by reference.

Numerous modifications and variations on the present invention are possible in light of the above teachings. It is therefore to be understood that within the scope of the appended claims, the invention may be practiced otherwise than as specifically described herein.

What is claimed is:

1. An aqueous dispersion for chemical mechanical polishing, comprising:

a powder of pyrogenically produced silicon dioxide doped with aluminum oxide;

wherein said powder comprises between 0.01 and 3 wt. % of said aluminium oxide; based on a total amount of said powder; and wherein an average particle diameter of said powder in said dispersion is not more than 0.1 $\mu$m; and wherein said aqueous dispersion has a pH of 8.5 to 11.

2. The aqueous dispersion according to claim 1, wherein an amount of said powder is between 5 and 50 wt. %.

3. The aqueous dispersion according to claim 1, wherein a BET surface area of said powder is between 50 and 90 m$^2$/g.

4. The aqueous dispersion according to claim 1, further comprising a member selected from the group consisting of a surface-active substance, a dispersing agent and a mixture thereof.

5. The aqueous dispersion according to claim 1, wherein said silicon dioxide is doped with aluminum oxide using an aerosol.

6. The aqueous dispersion according to claim 1, wherein said average particle diameter is a number-related particle diameter or a volume-related particle diameter.

7. The aqueous dispersion according to claim 1, wherein an amount of said surface-active substance is between 0.001 and 2 wt. %.

8. The aqueous dispersion according to claim 4, wherein said surface-active substance is selected from the group consisting of an anionic surface-active substance, a cationic surface-active substance, a non-ionic surface-active substance, an amphoteric surface-active substance and mixtures thereof.

9. The aqueous dispersion according to claim 4, wherein said surface-active substance is selected from the group consisting of sodium dodecyl sulfate, sodium lauryl sulfate, ammonium dodecyl sulfate and mixtures thereof.

* * * * *